United States Patent [19]

Dewitt et al.

[11] Patent Number: 5,020,999
[45] Date of Patent: Jun. 4, 1991

[54] PERSONAL COMPUTER WITH CONNECTOR ASSEMBLY HAVING INTEGRAL RETAINER

[75] Inventors: John R. Dewitt; Jay H. Neer, both of Boca Raton, Fla.

[73] Assignee: International Business Machines Corporation, Armonk, N.Y.

[21] Appl. No.: 556,932

[22] Filed: Jul. 19, 1990

[51] Int. Cl.⁵ .................... H01R 13/62; H01R 13/64
[52] U.S. Cl. .................................... 439/328; 439/377; 364/200
[58] Field of Search ................. 439/374, 377, 633, 64, 439/493, 325-328, 633; 364/200

[56] References Cited

U.S. PATENT DOCUMENTS

| | | | |
|---|---|---|---|
| 2,932,810 | 4/1960 | Novak | 439/328 X |
| 3,829,741 | 8/1974 | Athey | 361/399 |
| 3,930,707 | 1/1976 | Venaleck et al. | 439/325 |
| 3,932,016 | 1/1976 | Ammenheuser | 439/377 |
| 3,993,390 | 11/1976 | Eligenbrode | 439/358 |
| 4,017,138 | 4/1977 | Evans | 439/328 |
| 4,105,275 | 8/1978 | Dixon et al. | 439/358 |
| 4,168,877 | 9/1979 | Little et al. | 439/372 |
| 4,696,529 | 9/1987 | Verhoeven et al. | 439/325 X |
| 4,712,848 | 12/1987 | Edgley | 439/327 |
| 4,737,888 | 4/1988 | Bodnar et al. | 439/78 |
| 4,787,032 | 11/1988 | Culley | 364/200 |
| 4,897,054 | 1/1990 | Gilissen et al. | 439/493 X |

Primary Examiner—Larry I. Schwartz
Assistant Examiner—Julie R. Daulton
Attorney, Agent, or Firm—Daniel E. McConnell

[57] ABSTRACT

This invention relates to personal computers, and more particularly to personal computers having a connector assembly with an integral retainer enabling resistance to disconnection which would interfere with continued operation of the computer. A particular configuration of card edge connector is provided, and a mating cable end connector is provided with latches which engage and grip undercut portions of recesses adjacent the card edge connector.

4 Claims, 5 Drawing Sheets

PERSONAL COMPUTER WITH CONNECTOR ASSEMBLY HAVING INTEGRAL RETAINER

FIELD AND BACKGROUND OF INVENTION

This invention relates to personal computers, and more particularly to personal computers having a connector assembly with an integral retainer enabling resistance to disconnection which would interfere with continued operation of the computer.

Personal computer systems in general and IBM personal computers in particular have attained widespread use for providing computing capability to many segments of today's modern society. Personal computer systems can usually be defined as a desk top, floor standing, or portable microcomputer that consists of a system unit having a single system processor and associated volatile and non-volatile memory, a display monitor, a keyboard, one or more diskette drives, a fixed disk storage, and an optional printer. One of the distinguishing characteristics of these systems is the use of a motherboard or system planar to electrically connect these components together. These systems are designed primarily to give independent computing capability to a single user and are inexpensively priced for purchase by individuals or small businesses. Examples of such personal computer systems are IBM's PERSONAL COMPUTER AT and IBM's PERSONAL SYSTEM/2 Models 25, 30, 50, 60, 70 and 80.

These systems can be classified into two general families. The first family, usually referred to as Family I Models, use a bus architecture exemplified by the IBM PERSONAL COMPUTER AT and other "IBM compatible" machines. The second family, referred to as Family II Models, use IBM's MICRO CHANNEL bus architecture exemplified by IBM's PERSONAL SYSTEM/2 Models 50 through 80. The Family I models typically have used the popular INTEL 8088 or 8086 microprocessor as the system processor. These processors have the ability to address one megabyte of memory. The Family II models typically use the high speed INTEL 80286, 80386, and 80486 microprocessors which can operate in a real mode to emulate the slower speed INTEL 8086 microprocessor or a protected mode which extends the addressing range from 1 megabyte to 4 Gigabytes for some models. In essence, the real mode feature of the 80286, 80386, and 80486 processors provide hardware compatibility with software written for the 8086 and 8088 microprocessors.

In the development of personal computers such as those described, reliance has been placed on conventional printed circuit board or card technology to establish operative communication among functional components of the computer. Thus certain components may be mounted on a system planar or motherboard which provides for such interconnection, while others may be mounted on or interconnected by other cards or boards used in the system. Frequently, connections between such cards and certain other components are established by cables or the like. One common example is the connection necessary between a controller circuit and a direct access storage device such as a fixed or hard disk or a removable media device such as a floppy disk drive. Persona familiar with personal computers will be familiar with such interconnections and the flat, flexible, multiple conductor cables frequently used to make them.

It has been determined that one source of difficulty in the manufacture and delivery of such machines lies in the inadvertent disconnection of such cables during shipment and handling of the machine prior to its installation for use. Where such disconnection occurs, it is frequently necessary for a service call to be made simply to open the machine enclosure and reconnect a cable end connector which had become separated.

BRIEF DESCRIPTION OF INVENTION

With the foregoing discussion in mind, it is an object of this invention to retain cable end connectors in place connected with card edge connectors notwithstanding exertion of otherwise disruptive forces on the connectors during shipment and handling of a computer. In realizing this object of the invention, a particular configuration of card edge connector is provided, and a mating cable end connector is provided with latches which engage and grip undercut portions of recesses adjacent the card edge connector.

BRIEF DESCRIPTION OF DRAWINGS

Some of the objects of the invention having been stated, other objects will appear as the description proceeds, when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
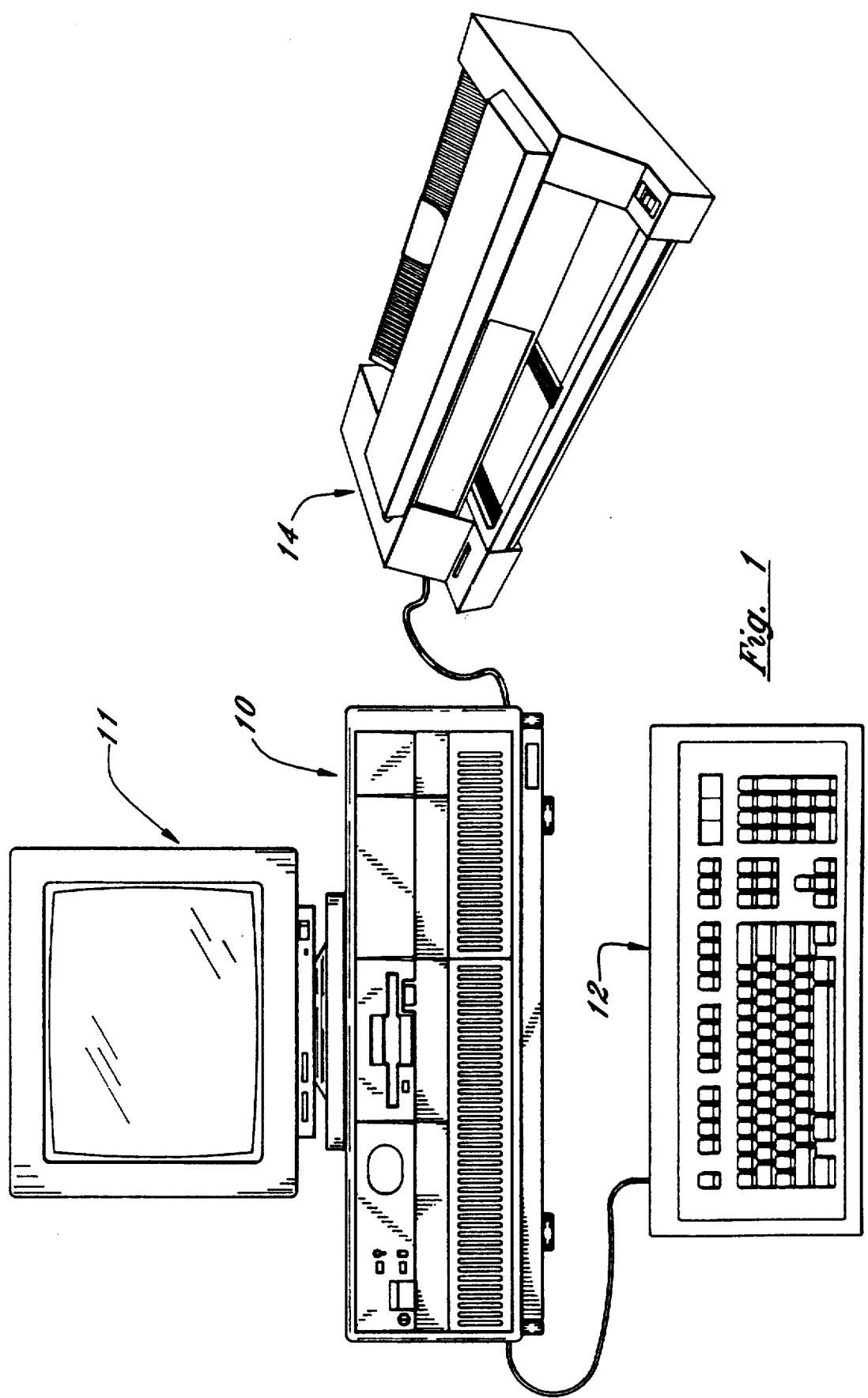
FIG. 1 is a perspective view of a personal computer embodying this invention.

Referring now more particularly to the accompanying drawings, a microcomputer embodying the present invention is there shown and generally indicated at 10 (FIG. 1). As mentioned hereinabove, the computer 10 may have an associated monitor 11, keyboard 12 and printer or plotter 14. The computer 10 has a cover 15 formed by a decorative outer member 16 (FIG. 2) and an inner shield member 18 which cooperate with a chassis 19 in defining an enclosed, shielded volume for receiving electrically powered data processing and storage components for processing and storing digital data. At least certain of these components are mounted on a multilayer planar 20 or motherboard which is mounted on the chassis 19 and provides a means for electrically interconnecting the components of the computer 10 including those identified above and such other associated elements as floppy disk drives, various forms of direct access storage devices, accessory cards or boards, and the like. As pointed out more fully hereinafter, provisions are made in the planar 20 for the passage of input/output signals to and from the operating components of the microcomputer.

Figure 2:
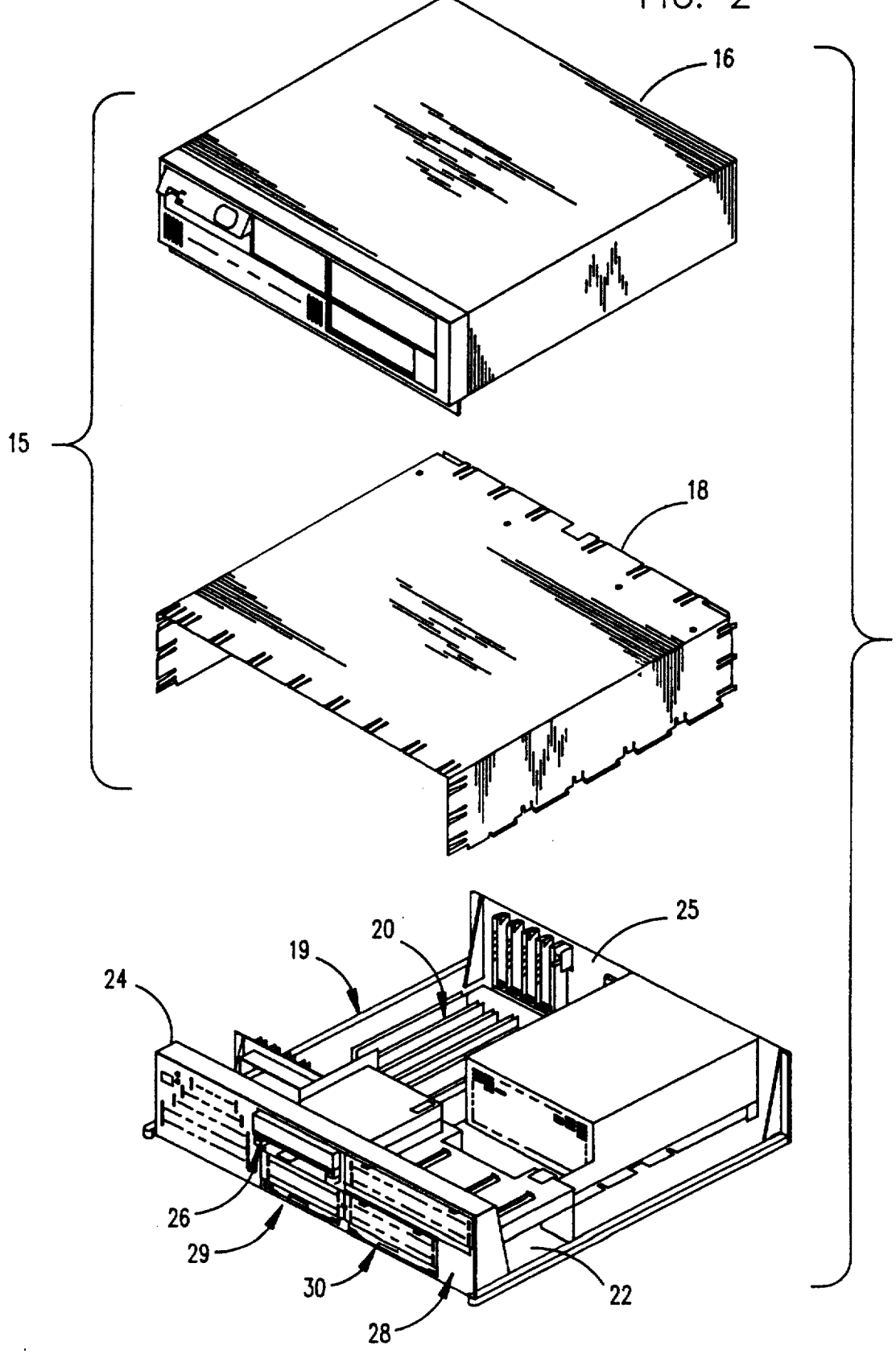
FIG. 2 is an exploded perspective view of certain elements of the personal computer of FIG. 1 including a chassis, a cover, an electromechanical direct access storage device and a planar board and illustrating certain relationships among those elements.

The chassis 19 has a base indicated at 22, a front panel indicated at 24, and a rear panel indicated at 25 (FIG. 2). The front panel 24 defines at least one open bay (and in the form illustrated, four bays) for receiving a data storage device such as a disk drive for magnetic or optical disks, a tape backup drive, or the like. In the illustrated form, a pair of upper bays 26, 28 and a pair of lower bays 29, 30 are provided. One of the upper bays 26 is adapted to receive peripheral drives of a first size (such as those known as 3.5 inch drives) while the other 28 is adapted to receive drives of a selected one of two sizes (such as 3.5 and 5.25 inch) and the lower bays are adapted to receive devices of only one size (3.5 inch).

Figure 3:
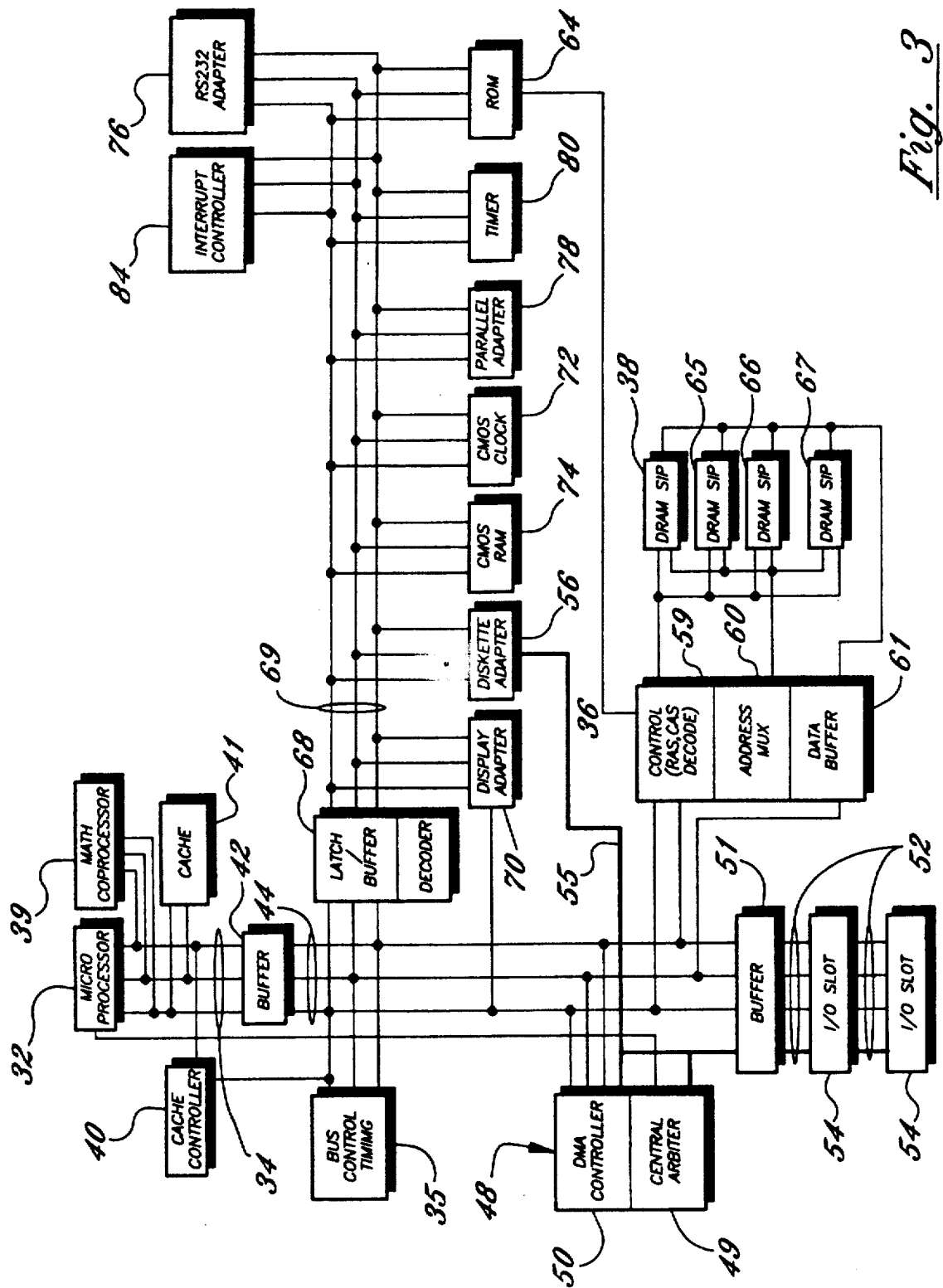
FIG. 3 is a schematic view of certain components of the personal computer of FIGS. 1 and 2.

Prior to relating the above structure to the present invention, a summary of the operation in general of the personal computer system 10 may merit review. Referring to FIG. 3, there is shown a block diagram of a personal computer system illustrating the various components of the computer system such as the system 10 in accordance with the present invention, including components mounted on the planar 20 and the connection of the planar to the I/O slots and other hardware of the personal computer system. Connected to the planar is the system processor 32 comprised of a microprocessor which is connected by a high speed CPU local bus 34 through a bus control timing unit 35 to a memory control unit 36 which is further connected to a volatile random access memory (RAM) 38. While any appropriate microprocessor can be used, one suitable microprocessor is the 80386 which is sold by INTEL.

While the present invention is described hereinafter with particular reference to the system block diagram of FIG. 3, it is to be understood at the outset of the description which follows that it is contemplated that the apparatus and methods in accordance with the present invention may be used with other hardware configurations of the planar board. For example, the system processor could be an Intel 80286 or 80486 microprocessor.

Returning now to FIG. 3, the CPU local bus 34 (comprising data, address and control components) provides for the connection of the microprocessor 32, a math coprocessor 39, a cache controller 40, and a cache memory 41. Also coupled on the CPU local bus 34 is a buffer 42. The buffer 42 is itself connected to a slower speed (compared to the CPU local bus) system bus 44, also comprising address, data and control components. The system bus 44 extends between the buffer 42 and a further buffer 68. The system bus 44 is further connected to a bus control and timing unit 35 and a DMA unit 48. The DMA unit 48 is comprised of a central arbitration unit 49 and DMA controller 50. The buffer 51 provides an interface between the system bus 44 and an optional feature bus such as the MICRO CHANNEL bus 52. Connected to the bus 52 are a plurality of I/O slots 54 for receiving MICRO CHANNEL adapter cards which may be further connected to an I/O device or memory.

An arbitration control bus 55 couples the DMA controller 50 and central arbitration unit 49 to the I/O slots 54 and a diskette adapter 56. Also connected to the system bus 44 is a memory control unit 36 which is comprised of a memory controller 59, an address multiplexor 60, and a data buffer 61. The memory control unit 36 is further connected to a random access memory as represented by the RAM module 38. The memory controller 36 includes the logic for mapping addresses to and from the microprocessor 32 to particular areas of RAM 38. This logic is used to reclaim RAM previously occupied by BIOS. Further generated by memory controller 36 is a ROM select signal (ROMSEL), that is used to enable or disable ROM 64.

While the microcomputer system 10 is shown with a basic 1 megabyte RAM module, it is understood that additional memory can be interconnected as represented in FIG. 3 by the optional memory modules 65 through 67. For purposes of illustration only, the present invention is described with reference to the basic one megabyte memory module 38.

A latch buffer 68 is coupled between the system bus 44 and a planar I/O bus 69. The planar I/O bus 69 includes address, data, and control components respectively. Coupled along the planar I/O bus 69 are a variety of I/O adapters and other components such as the display adapter 70 (which is used to drive the monitor 11), a CMOS clock 72, nonvolatile CMOS RAM 74 herein after referred to as NVRAM, a RS232 adapter 76, a parallel adapter 78, a plurality of timers 80, a diskette adapter 56, an interrupt controller 84, and a read only memory 64. The read only memory 64 includes the BIOS that is used to interface between the I/O devices and the operating system of the microprocessor 32. BIOS stored in ROM 64 can be copied into RAM 38 to decrease the execution time of BIOS. ROM 64 is further responsive (via ROMSEL signal) to memory controller 36. If ROM 64 is enabled by memory controller 36, BIOS is executed out of ROM. If ROM 64 is disabled by memory controller 36, ROM is not responsive to address enquiries from the microprocessor 32 (i.e. BIOS is executed out of RAM).

The planar I/O bus 69, as described hereinafter, includes portions defined by conductive pathways formed in interior layers of the multilayer planar 20, and particularly includes a number of such pathways in a portion extending adjacent an edge of the planar 20 which is positioned to extend adjacent one of the front and rear panels of the chassis. Such design of the planar makes possible the location of a number of I/O connectors along such a side edge for exchange of signals with such devices as the monitor, keyboard and printer.

The clock 72 is used for time of day calculations and the NVRAM is used to store system configuration data. That is, the NVRAM will contain values which describe the present configuration of the system. For example, NVRAM contains information describing the capacity of a fixed disk or diskette, the type of display, the amount of memory, time, date, etc. Of particular importance NVRAM will contain data (can be one bit) which is used by memory controller 36 to determine whether BIOS is run out of ROM or RAM and whether to reclaim RAM intended to be used by BIOS RAM. Furthermore, these data are stored in NVRAM whenever a special configuration program, such as SET Configuration, is executed. The purpose of the SET Configuration program is to store values characterizing the configuration of the system to NVRAM.

As mentioned hereinabove, the computer has a cover indicated generally at 15 which cooperates with the chassis 19 in forming an enclosed, shielded volume for containing the above identified components of the microcomputer. The cover preferably is formed with an outer decorative cover member 16 which is a unitary molded component made of a moldable synthetic material and a metallic thin sheet liner 18 formed to conform to the configuration of the decorative cover member. However, the cover can be made in other known ways and the utility of this invention is not limited to enclosures of the type described.

Figure 4:
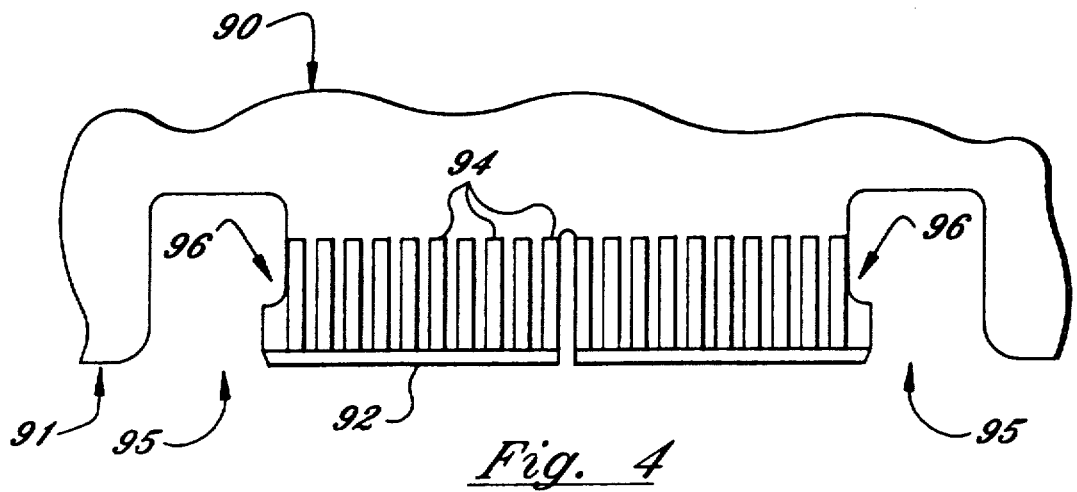
FIG. 4 is an enlarged view of a side edge portion of a printed circuit card used in the computer of FIG. 1.
Figure 5:
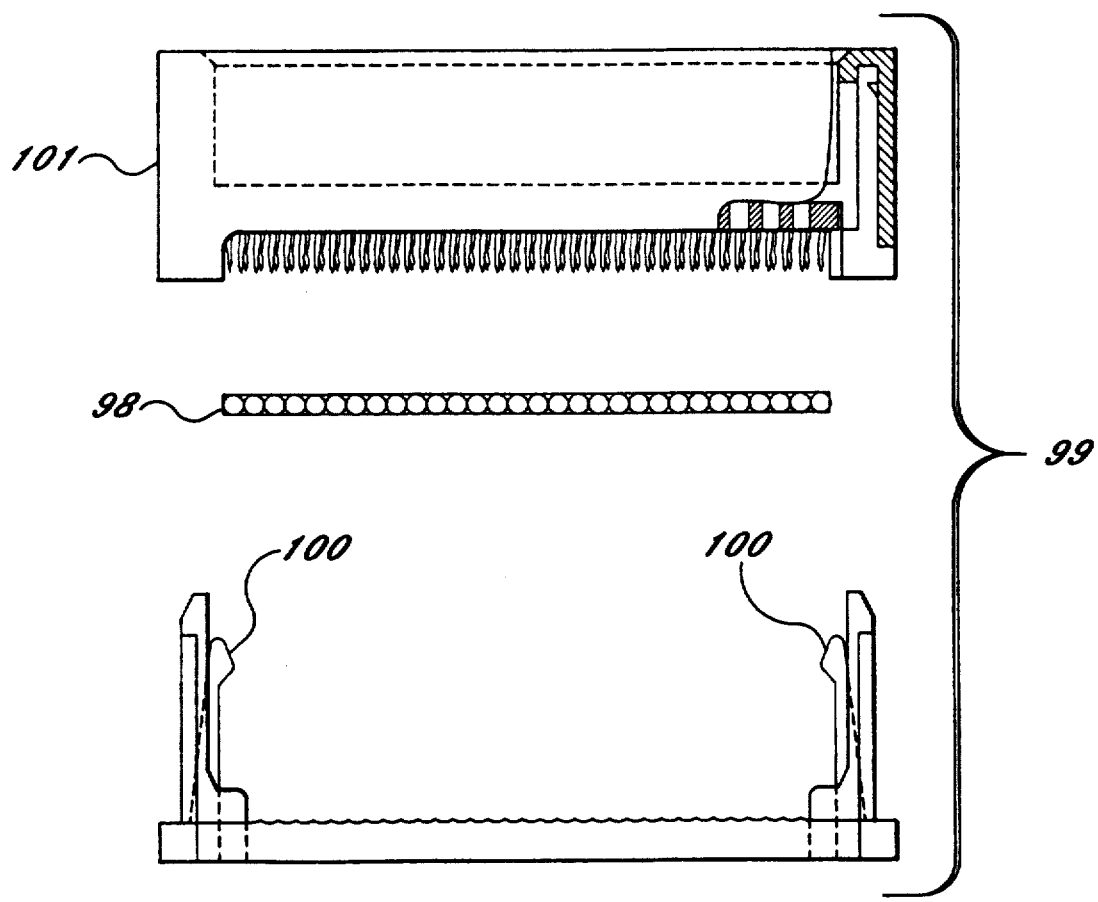
FIG. 5 is an enlarged view of components of a connecting cable and cable end connector used in the computer of FIG. 1.
Figure 6:
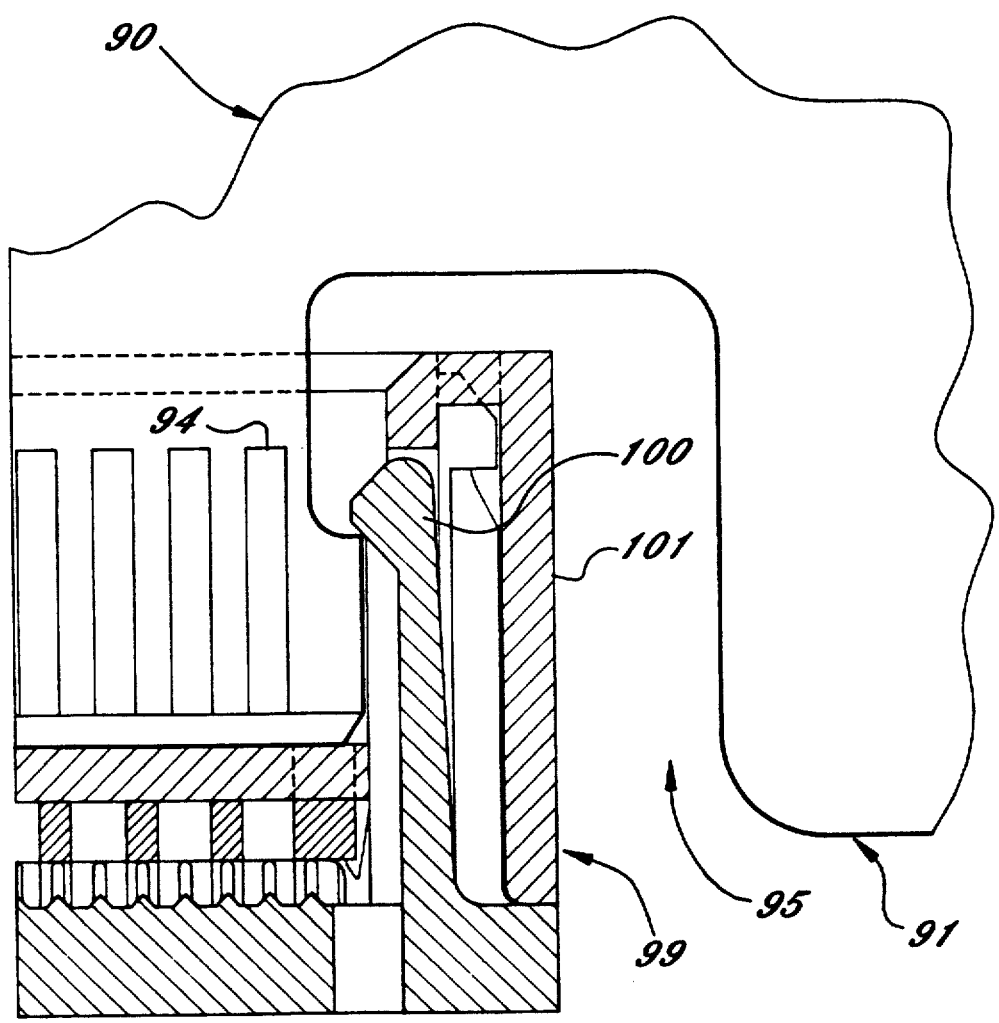
FIG. 6 is an enlarged view of the cable and cable end connector of FIG. 5 assembled and connected with the side edge portion of the printed circuit card shown in FIG. 4.

As mentioned hereinabove, the personal computer 10 has at least one printed circuit card (90 in FIG. 4) for interconnecting functional components of the computer. Such a card defines a plane and has an elongate side edge 91 with a card edge connector portion 92 being defined intermediate the length of the side edge 91 and having a plurality of conductive strips 94 for communicating signals among components interconnected by said card. The technology of making such cards and card edge connectors is well known to persons of skill in the applicable arts, and thus no detailed description of such elements will be given here.

In order to accomplish the retention of a connected cable as described more fully hereinafter, the card edge connector portion 92 is defined by a pair of recesses 95 formed in the card 90 immediately adjacent opposite ends of the connector portion 92 and intermediate the length of the side edge 91. Each of the recesses defines an undercut portion 96 spaced inwardly of the card from the side edge and having a predetermined dimension measured perpendicularly to the side edge, with the undercut portion of each recess extending parallel to the side edge and toward the other of the recesses.

A multiple conductor cable 98 is provided for connection with the conductive strips 94 of the card edge connector. At the terminating end of the cable 98 is provided a cable end connector 99 engaging the cable for establishing signal communicating connection of the conductors of the cable with the card 90 and the conductive strips 94. The cable end connector has a pair of latches 100 for entering into the recesses 95 and for grippingly engaging the undercut portions 96 for exerting forces retaining the cable end connector in connection with the card.

In the illustrated embodiment, the recesses 95 have predetermined dimensions perpendicularly to the card side edge 91 and the cable end connector 99, when connected to the card, penetrates substantially fully into the recesses. Additionally, the undercut portions 96 of the recesses 95 have a dimension perpendicularly to the card side edge approximately one half the dimension of recesses themselves.

The cable end connector 99 preferably comprises a housing member 101 for substantially enclosing the card edge connector portion 92 and the latches 100. Each of the latches comprises an elongate member 102 having a base end fixed in the housing member 101 and an engagement end, and with the engagement ends of the latches being biased one toward the other for exerting on the card side edge a gripping force directed longitudinally thereof.

In the drawings and specifications there has been set forth a preferred embodiment of the invention and, although specific terms are used, the description thus given uses terminology in a generic and descriptive sense only and not for purposes of limitation.

What is claimed is:

1. A personal computer comprising:
   a printed circuit card for interconnecting functional components of the computer, said card defining a plane and having an elongate side edge,
   a card edge connector portion defined by said card intermediate the length of said side edge and having a plurality of conductive strips extending adjacent said connector portion for communicating signals among components interconnected by said card,
   said card edge connector portion being defined by a pair of recesses formed in said card immediately adjacent opposite ends of said connector portion and intermediate the length of said side edge, each said recess defining an undercut portion spaced inwardly of said card from said side edge and having a predetermined dimension measured perpendicularly to said side edge, said undercut portion of each of said recesses extending parallel to said side edge,
   a multiple conductor cable for connection with said conductive strips, and
   a cable end connector engaging said cable for establishing connection thereof with said card and said conductive strips, said cable end connector having a housing member for substantially enclosing said card edge connector and a pair of latches enclosed within said housing member for entering into said recesses and for grippingly engaging said undercut portions for exerting forces retaining said cable end connector in connection with said card, each of said latches comprising an elongate member having a base end fixed in said housing member and an engagement end, said engagement ends of said latches being biased one relative to the other for exerting on said side edge a gripping force directed longitudinally thereof.

2. A personal computer according to claim 1 wherein said recesses have predetermined dimensions perpendicularly to said side edge and said cable end connector, when connected to said card penetrates substantially fully into said recesses.

3. A personal computer according to claim 2 wherein said undercut portions of said recesses have a dimension perpendicularly to said side edge approximately one half the dimension of said recesses.

4. A personal computer system having a high speed system, processor compatible with application programs and operating system software designed to execute on slower speed system processors, said personal computer system comprising:
   a high speed microprocessor having a real and protected mode of operation coupled to a high speed data bus;
   non-volatile memory electrically coupled to a slower speed data bus;
   bus controller for providing communications between the high speed data bus and the slower speed data bus;
   volatile memory electrically responsive to the high speed data bus;
   memory controller electrically coupled to said volatile memory and said non-volatile memory, said memory controller regulating communications between said volatile memory and said high speed microprocessor;

a printed circuit card for interconnecting functional components of the computer, said card defining a plane and having an elongate side edge, a card edge connector portion defined by said card intermediate the length of said side edge and having a plurality of conductive strips extending adjacent said connector portion for communicating signals among components interconnected by said card, said card edge connector portion being defined by a pair of recesses formed in said card immediately adjacent opposite ends of said connector portion and intermediate the length of said side edge, each said recess defining an undercut portion spaced inwardly of said card from said side edge and having a predetermined dimension measured perpendicularly to said side edge, said undercut portion of each of said recesses extending parallel to said side edge, a multiple conductor cable for connection with said conductive strips, and a cable end connector engaging said cable for establishing connection thereof with said card and said conductive strips, said cable end connector having a housing member for substantially enclosing said card edge connector and a pair of latches enclosed within said housing member for entering into said recesses and for grippingly engaging said undercut portions for exerting forces retaining said cable end connector in connection with said card, each of said latches comprising an elongate member having a base end fixed in said housing member and an engagement end, said engagement ends of said latches being biased one relative to the other for exerting on said side edge a gripping force directed longitudinally thereof.

* * * * *